(12) United States Patent
Jonasson (10) Patent No.: US 11,758,706 B2
(45) Date of Patent: Sep. 12, 2023

(54) METHOD AND SYSTEM FOR DETERMINING COMPONENT ILLUMINATION SETTINGS

(71) Applicant: Mycronic AB, Taby (SE)

(72) Inventor: Roger Jonasson, Taby (SE)

(73) Assignee: Mycronic AB, Taby (SE)

( * ) Notice: Subject to any disclaimer, the term of this patent is extended or adjusted under 35 U.S.C. 154(b) by 0 days.

(21) Appl. No.: 17/503,726

(22) Filed: Oct. 18, 2021

(65) Prior Publication Data

US 2022/0039305 A1 Feb. 3, 2022

Related U.S. Application Data

(62) Division of application No. 16/628,806, filed as application No. PCT/EP2018/067638 on Jun. 29, 2018, now Pat. No. 11,178,801.

(30) Foreign Application Priority Data

Jul. 12, 2017 (SE) .................................. 1730194-6

(51) Int. Cl.
*H05K 13/08* (2006.01)
*H05B 47/105* (2020.01)
(Continued)

(52) U.S. Cl.
CPC ......... *H05K 13/0812* (2018.08); *G03B 15/02* (2013.01); *G06T 7/0004* (2013.01);
(Continued)

(58) Field of Classification Search
None
See application file for complete search history.

(56) References Cited

U.S. PATENT DOCUMENTS 6,040,895 A * 3/2000 Haas .................. H05K 13/0812
356/399
6,546,126 B1 * 4/2003 Wittmann .......... H05K 13/0812
250/559.46

(Continued)

FOREIGN PATENT DOCUMENTS

| EP | 2797399 A1 | 10/2014 |
| WO | WO-2010/109455 A1 | 9/2010 |
| WO | WO-2013/138148 A1 | 9/2013 |

OTHER PUBLICATIONS

International Search Report PCT/ISA/210 for International Application No. PCT/EP2018/067638 dated Oct. 9, 2018.

(Continued)

*Primary Examiner* — Reza Aghevli
(74) *Attorney, Agent, or Firm* — Harness, Dickey & Pierce, P.L.C.

(57) ABSTRACT

A method, a system and an archive server for determining an illumination setting for capturing an image of a component, belonging to a specific package type, in a pick-and-place machine are provided. The method comprises capturing a first image of a first component of the specific package type while the first component is illuminated by a first illumination component, and capturing a second image of the first component while the first component is illuminated by a second illumination component, the second illumination component being different from the first illumination component. An illumination setting may then be determined by creating a plurality of generated images based on the first and second image of the first component, and selecting the generated image that fulfils a predetermined quality measure.

17 Claims, 6 Drawing Sheets

(51) Int. Cl.
*G03B 15/02* (2021.01)
*G06T 7/00* (2017.01)
*H04N 23/72* (2023.01)

(52) U.S. Cl.
CPC ........... *H04N 23/72* (2023.01); *H05B 47/105* (2020.01); *G06T 2207/30164* (2013.01)

(56) References Cited

U.S. PATENT DOCUMENTS

| | | | |
|---|---|---|---|
| 6,610,991 | B1 | 8/2003 | Case |
| 9,717,118 | B2* | 7/2017 | Chen ...................... H05B 47/19 |
| 10,264,651 | B2* | 4/2019 | Steiner ................... H05B 47/19 |
| 10,502,442 | B2* | 12/2019 | Guan ..................... H05B 47/105 |
| 10,508,823 | B2* | 12/2019 | Guan ..................... H05B 47/19 |
| 10,602,587 | B2* | 3/2020 | Steiner ................... H05B 47/18 |
| 2002/0074480 | A1 | 6/2002 | Wasserman |
| 2003/0110610 | A1 | 6/2003 | Duquette et al. |
| 2006/0163355 | A1 | 7/2006 | Olmstead et al. |
| 2007/0074390 | A1* | 4/2007 | Ota ....................... H05K 13/041 29/832 |
| 2012/0181338 | A1 | 7/2012 | Gao |
| 2012/0206050 | A1* | 8/2012 | Spero ................... B60Q 1/1423 315/152 |
| 2013/0206839 | A1 | 8/2013 | Gao |
| 2015/0023019 | A1* | 1/2015 | Chen .................... H05B 47/115 362/276 |
| 2017/0108235 | A1* | 4/2017 | Guan ................... H05B 47/105 |
| 2017/0108236 | A1* | 4/2017 | Guan ................... G05B 19/042 |
| 2017/0171941 | A1* | 6/2017 | Steiner ................. H04N 7/188 |
| 2018/0167547 | A1* | 6/2018 | Casey ................. H04N 1/40012 |
| 2019/0182927 | A1* | 6/2019 | Steiner ................. H04N 7/188 |

OTHER PUBLICATIONS

European Communication pursuant to Article 94(3) EPC dated Nov. 22, 2022 for corresponding European Application No. 18739478.8.
European Communication pursuant to Article 94(3) EPC dated Sep. 27, 2021 for corresponding European Application No. 18739478.8.

* cited by examiner

METHOD AND SYSTEM FOR DETERMINING COMPONENT ILLUMINATION SETTINGS

CROSS-REFERENCE TO RELATED APPLICATIONS

This application is a divisional of U.S. application Ser. No. 16/628,806, filed Jan. 6, 2020, which is a national phase under 35 U.S.C. § 371 of PCT International Application No. PCT/EP2018/067638 which has an International filing date of Jun. 29, 2018, which claims priority to Sweden Application No. 1730194-6, filed Jul. 12, 2017, the entire contents of each of which are hereby incorporated by reference.

FIELD OF THE INVENTION

The present invention generally relates to the field of pick-and-place machines. More specifically, the present invention relates to a method, a system and an archive server for verifying components in a pick and place machine.

BACKGROUND OF THE INVENTION

When mounting components on a printed circuit board using a component mounting machine there is a need for close precision. In order to achieve this an image processing device is often used for obtaining and analysing an image of the component after it has been picked up by means of a mounting head. The aim of the analysis is to determine the type and position of the component on the mounting head before it is mounted on a workpiece. When the position of the component to be mounted is known, the component mounting machine can compensate for the translation and rotation of the component before it is mounted on the printed circuit board. Further, in the analysis the image of the component to be mounted can be examined for faults, such as wrong component type, missing leads, erroneous leads or incorrectly positioned leads.

To ensure that the component is correctly picked up and that the component itself is not of the wrong type or defective, the component may be lit from below or at an angle, photographed and then analyzed. Image analysis may the employed to verify the component. This required the component mounting machine to be calibrated to find a good light settings that enables a correct image analysis. The light settings may e.g. be determined by capturing a number of images of the component with different light settings, and using the best light setting for evaluating the component. This process may be error prone and time consuming, and there is no easy way of updating the calibration if needed.

Hence, there is a need for an improved calibration of light settings and an improved way of verifying for components in pick-and-place machines.

SUMMARY

An object of the present disclosure is therefore to mitigate some of the drawbacks described above. To achieve this, a method, a system and an archive server are provided. Further embodiments are defined in the dependent claims.

Hence, according to a first aspect, a method for determining an illumination setting for capturing an image of a component, belonging to a specific package type, in a pick-and-place machine is provided. The method comprises capturing a first image of a first component of the specific package type while the first component is illuminated by a first illumination component, and capturing a second image of the first component while the first component is illuminated by a second illumination component, the second illumination component being different from the first illumination component. The method further comprises generating, by the use of software manipulation of the first image and the second image, a plurality of generated images of the first component, wherein each one of the plurality of generated images comprises a specific combination of an illumination intensity level of the first illumination component and an illumination intensity level of the second illumination component, selecting at least one of the plurality of generated images that fulfils a quality measure, and determining, based on the selected generated image, an illumination setting associated with the package type, wherein the determined illumination setting comprises a first intensity level for the first illumination component and a second intensity level for the second illumination component.

According to a second aspect, a system for verifying components, belonging to a specific package type, in a pick-and-place machine, is provided. The system comprises a first illumination source for illuminating a first component of the specific package type by a first illumination component and a second illumination source for illuminating the first component by a second illumination component, the second illumination component being different from the first illumination component. The system further comprises a camera for capturing a first image of the component while illuminated by the first illumination component and a second image of the component while illuminated by the second illumination component. The system further comprises a processing means configured to generate, by the use of software manipulation of the first image and the second image, a plurality of generated images of the first component, wherein each one of the plurality of generated images comprises a specific combination of an illumination intensity level of the first illumination component and an illumination intensity level of the second illumination component and select at least one of the plurality of generated images that fulfils a predetermined quality measure. The processor is further configured to determine, based on the selected generated image, an illumination setting associated with the package type, wherein the determined illumination setting comprises a first intensity level for the first illumination component and a second intensity level for the second illumination component.

With the present inventive concept, an illumination setting for a component may be determined based on a relatively small number of captured images. The images captured with different illumination modes correspond to different illumination settings for the illumination sources and may be used by software to generate and determine an image that fulfils certain quality measures. The generated image corresponds to different intensity settings for the different illumination components, which allow for an optimal illumination setting to be determined. In this way, the calibration of the illumination used by the pick and place machine may be automated, and the time and effort for calibrating the machine may thereby be decreased.

It has been realized that with software and a small number of reference images, i.e. the images captured with different illumination components, a high number of possible images (i.e., combinations of illumination settings) may be generated. Software may generate a plurality of images based on the first and second images and determine which one of the computer generated images that fulfils the quality demands. This image, which this may be a combination of the reference images, correspond to a particular illumination setting, according to which the different illumination sources may be operated. Hence, different available illumination settings may be evaluated in software without having to capture a vast number of images of the component illuminated with fixed illumination settings. Instead, images may be software generated to evaluate different simulated illumination settings for the illumination sources.

In prior solutions, the calibration of the illumination setting for a component of a package type in a pick and place machine is done manually by adjusting the light settings, capturing a vast number of images with fixed illumination settings, and finally deciding on a setting that is good enough. As this is a manual process, it may be error prone and thereby causing a high percentage of false negatives, i.e. components are discarded as incorrectly aligned or defective when they should have been mounted. Further, if one light setting seems to be incorrect when later used in the pick and place machine, there is no simple way of adjusting the light setting again, but the process has to be restarted from the beginning. Alternatively, the vast number of images may be stored in a database, but that may quickly be unmanageable.

The present inventive concept is associated with several advantages. First, as, described above, the calibration of the illumination settings for a pick and place machine may be automated, and the time and effort for calibrating the machine may thereby be decreased.

Second, as the process of calibrating the pick and place machine is automated, the number of errors in calibration may be decreased and the detail level may be increased— especially in comparison with manual calibration of the illumination settings. The number of images that can be evaluated is increased when the process is automated, enabling for finding a better image for evaluating the component, and thereby determining a better illumination setting.

Third, as only a small number of images is needed, for example one or a few for each illumination component, the images may be stored for later use or recalibration of the pick and place machine. With the images stored, the calibration as described above may be performed based on those images at a later point in time, or they may be used as training or verification data for a machine learning algorithm, thereby improving the algorithm for generating illumination settings.

A "pick and place machine" may be any pick and place or mounting machine suitable for mounting components on a workpiece. It should be noted that the present inventive concept may be used regardless of the type of pick and place machine, the mounting head type or the type of feeding in the machine.

In the present specification, the term "component" may refer to an electric component to be mounted on a workpiece. The component may e.g. be delivered on a tray or component tape, and transported to the picking head by a component feeding mechanism.

A "package" should be understood as the chip carrier or encapsulation of the chip, which together with the chip may form the component. The package may comprise contacting means, such as e.g. pins, leads or contacts through which the component may be operably connected to the workpiece. A "package type" refer to the type of package in terms of e.g. physical dimensions, functional characteristics of the component, lead pitch, case materials, contact types, etcetera. Information of such characteristics may also be referred to as package data. The package types for components may further be divided into families with common or similar characteristics. It will be appreciated that, according to embodiments of the present invention, the package data may be complemented with the determined illumination settings.

By "workpiece" it is meant, for example, a printed circuit board or substrate, or other piece of material that components may be mounted on.

By "quality measure" it may be meant predetermined features of an image, such as contrast, color, brightness, or similar, or it may be pre-generated quality measures as determined by a machine learning algorithm.

It will be appreciated that an "illumination component" or "illumination mode" may be refer to a specific illumination condition of the electric component. The illumination condition may be generated by one or several illumination sources or illumination arrangements, and may e.g. be characterized by the combination of color, angle of incidence, intensity or other parameters affecting the imaging of the component.

The determined illumination setting may use different illumination sources with different intensities to form a specific illumination condition of the component. As an illustrative example only, the illumination setting may comprise a first illumination setting for the first illumination source, for example 50% of maximum intensity, and a second illumination setting for the second illumination source, for example an intensity of 75% of maximum.

The first image of the first component when illuminated by the first illumination component and the second image of the first component when illuminated by the second illumination component may in the present application be refereed to as "reference images".

It will be appreciated that the system according to the second aspect of the present disclosure may be referred to as "verification system".

According to a third aspect, an archive server is provided. The archive server has at its disposal a first communication interface adapted to receive, from a system as described with reference to the second aspect, an illumination setting associated with a first component of a specific package type, a storing unit adapted to store the illumination setting, and a second communication interface adapted to provide the illumination setting upon request by a user. The archive server may be any type of server, local or remote to a pick and place machine, capable of receiving and serving data. The archive server may be capable of receiving data from multiple pick and place machines.

In this way, the archive server may receive an illumination setting associated with a component of a package type or component type. The archive server may receive data from one or several pick and place machines. The received illumination settings may be stored and reused by other users and pick and place machines. By reusing illumination settings, the time and effort for calibrating pick and place machines may be decreased.

According to an embodiment of the first aspect, the method according to the first aspect may further comprise the subsequent steps of capturing an image of a second component of the specific package type while the second component is illuminated according to the determined illumination settings, and determining, based on an analysis of the captured image, whether the second component shall be discarded or placed on a workpiece. These steps may also be referred to as "verification steps", as it is determined if a component should be discarded or placed on a workpiece, i.e. verifying the correctness of the component.

The analysis of the captured image may be a static algorithm based on predetermined parameter, such as orientation, number of leads, the presence of a marking, etc., or it may be based on a machine learning algorithm trained on similar data sets (as for example retrieved from an archive server storing information from a plurality of users).

By using the determined illumination setting when capturing the image of the component as held by the mounting head, it can be determined, by analysis of the captured image, if the component should be discarded or placed on a workpiece. This allows for decreasing the number of faulty or incorrectly picked components, thereby avoiding mounting erroneous components and increasing the quality of the product.

According to an embodiment, the method further comprises capturing, in case it is determined that the second component shall be discarded, a verification image of the second component while the second component is illuminated according to a verification illumination setting, and determining, based on an analysis of the captured verification image, whether the second component shall be discarded or placed on the workpiece.

In this way, a determination that a component should be discarded may be evaluated a second time with a second, i.e. a verification, illumination setting that may be specific for determining certain errors, for example that the component is incorrectly picked up, or an illumination setting specific for determining that all leads are correct. With this verification image, as the illumination setting may be different from the first image, a better analysis may be performed for the specific problem as determined by the first image. In other words, it can be determined if the second component should have been determined to be discarded. If it is determined that the component should not have been discarded in the previous step, the component may be mounted. In this way, the number of false negatives may be decreased.

According to an embodiment, the captured image may be analysed with regard to at least one of the following parameters: shape or outline of the component, or position or orientation as held by a mounting head of the pick-and-place machine.

By analyzing the shape or outline of the component it may be determined whether the component is of the expected type, if the component itself is defective or not, for example if the component have all the expected leads, if it has the expected shape, or similar visual features for verifying it. By determining the position or orientation of the component as held by the mounting head it may be determined if the component was correctly picked up. Even if the component itself is not defective, it may not be suitable for mounting if it was not correctly picked, for example if it has a too large rotation in comparison to the expected position.

With this analysis, faulty or incorrectly picked up components may be discarded, thereby avoiding errors in the product assembled by the pick and place machine.

According to an embodiment, the first component may be held by a mounting head of the pick-and-place machine during the capturing of the first and second images.

The images of the first component may in this way be captured in the same way as they will be used when verifying subsequent components, i.e. as held by the mounting head.

As the images are captured in the same component both when calibrating the machine and when verifying the components in a later step, the images may be more relevant and the generated images, and thereby the determined illumination setting, may be of higher quality, i.e. be better for evaluating the components. Higher quality images may lead to fewer errors in the determination of whether a component should be mounted or not.

According to an embodiment, the predetermined quality measure may correspond to a highest image contrast. Thus, the generated images may be evaluated for contrast, and the selected image may correspond to the one having the highest contrast.

With a high contrast in the selected image, the illumination setting may be selected such that the captured images are images with high contrasts. This may improve the evaluation of if the component is defective, for example is missing or having a defect lead, and to determine the orientation and position of the component in the mounting head.

According to an embodiment, the method further comprises capturing a background illumination image of the first component, and subtracting the background illumination image from the first image and the second image prior to the generating of the plurality of generated images.

A background image may be an image captured without actively illuminating the component by any of the illumination sources, such that the component is only illuminated by background light. By subtracting the background illumination image form the captured images, background noise or background light, i.e data irrelevant for the intensity of the images relative to each other, may be removed. Removing the background image may also improve the quality of the generated images as the background is not accounted for several times (one for each image used when generating the generated images). The background image may be subtracted from the first and second images before the generated images are provided by means of the software. This allows for higher quality generated images and facilitates the determining of optimal illumination settings, which in turn may improve the verification of the components, i.e. if a component should be mounted or discarded.

According to an embodiment, the background illumination image is added to the selected one of the plurality of generated images that fulfils the quality measure. The resulting image may then be stored as a reference image to be used when determining whether a subsequent component of the specific package type shall be discarded or placed on a workpiece.

As the background illumination, or the background light, will be present when capturing images of the second component, adding the background illumination image to the generated images before evaluating them based on the quality measure, the determined illumination setting based on that images may better correspond to the images captured when verifying components.

According to an embodiment, the intensity level of the first illumination component, during the capturing of the first image, may be selected such that at least some pixels of the first image are saturated or almost saturated, and/or the intensity level of the second illumination component, during the capturing of the second image, may selected such that at least some pixels of the second image are saturated or almost saturated. This may be considered to be the maximum intensity for that illumination component, and thereby the maximum intensity that can be determined and used when verifying components.

Having the intensity levels of the illumination components be as high as possible, for example, as high as possible to capture by the images in a relevant way without loosing granularity, the possible combinations of images is increased. For example, using 80% of the illumination maximum intensity for an illumination source when capturing an image, gives a possible determined illumination setting between 0-80%, whereas if a 100% of the illumination setting for the illumination source would have been used, the possible determined illumination setting may be between 0-100%.

According to an embodiment, the first illumination component represents illumination of the component from a first angle and the second illumination component represents illumination of the component from a second angle, the second angle being different from the first angle. By using different angles for the illumination components, different parts of the component may be lit or highlighted.

This allows for further improving the generated images, as more parts of the component may be visible with the different illumination components. When the quality of the selected generated image may increase, the illumination setting may be better determined, and the evaluation of the second component may be improved.

According to an embodiment, the first illumination component represents illumination with light of a first colour and the second illumination component represents illumination with light of a second colour, the second colour being different from the first colour.

By using different colors for the illumination components, different parts of the component may be highlighted, have higher contrast or different colors may be more visible. This allows for further improving the generated images, as more parts of the component will be visible with the different illumination components. When the quality of the selected generated image may increase, the illumination setting may be better determined, and the evaluation of the second component may be improved.

According to an embodiment, the method further comprises uploading the determined illumination setting to an archive server. An archive server may be any type of server capable of receiving and storing the illumination settings to be uploaded.

By uploading the illumination setting to an archive server, the illumination setting may be reused and thereby decreasing the time for calibrating another pick and place machine. More details regarding the archive server will be described below with reference to a third aspect of the invention.

If it has been determined that a component should be discarded, the method may further comprise uploading the reference images, i.e. the first and second images captured of the first component, to the archive server and uploading the captured image or images based on which the determination to discard the component has been made. In this way, the images may later be reused to improve the algorithm for determining illumination settings or the algorithm for determining whether a component should be mounted or not. In a similar way, data may also be sent to an archive server when a component is determined to be mounted.

According to an embodiment, the first and second illumination components are selected from the list comprising: dark field illumination, front light illumination, and ambient illumination. By dark field illumination it may be meant that the component is illuminated by light from the sides of the component, which causes the component to appear light against a dark background. The front light illumination may be illumination from the same angle as the camera, i.e. from the front side. Ambient illumination may mean illumination from different sides of the component.

According to an embodiment of the second aspect, the camera is further adapted to capture an image of a second component of the specific package type while the second component is illuminated according to the determined illumination setting, and wherein the processing means is further configured to determine, based on an analysis of the captured image of the second component, whether the second component shall be discarded or placed on a workpiece.

The analysis of the captured image by the processing means may be a static algorithm based on predetermined parameter, such as orientation, number of leads, the presence of a marking, etc, or it may be based on a machine learning algorithm trained on similar data sets.

By using the determined illumination setting when capturing the image of the component as held by the mounting head, it can be determined, by analysis of the captured image, if the component should be discarded or placed on a workpiece. This allows for decreasing the number of faulty or incorrectly picked up components, thereby avoiding mounting erroneous components and increasing the quality of the product.

According to an embodiment of the third aspect, the storing unit of the archive server is adapted to store package data relating to the first component, and to complement the package data with one or several illumination settings associated with the first component. In this way, data regarding different components of the same package type may be interrelated.

According to an embodiment, the archive server further has at its disposal a third communication interface adapted to receive, from the system according to the second aspect, the images of a component captured by the camera when illuminated by the first and second illumination components. Via the third communication interface, the archive server may receive reference images, verification images or other types of images as captured by a pick and place machine.

For example, the reference images as captured when calibrating the pick and place machine for a new component may be received by the archive server via the third communication interface.

For another example, when a component is rejected, it is unclear if other light settings could result in better images to make the verification system take better decisions. If images of all components that are rejected are stored together with the reference images in the archive server, it allows for further processing of the data to determine better illumination settings, which may lead to fewer false negatives or false positives.

The received or collected data may be used for optimizing or improving algorithms for determining whether components should be discarded or mounted, and for algorithms for determining preferred illumination settings for a specific component type or a specific component of a package type. The data may also be used as training or verification data for machine learning algorithms for determining preferred illumination settings or whether components should be discarded or mounted.

The inventive concept disclosed may be embodied as computer readable instructions for controlling a programmable computer in such manner that it causes a pick and place machine, a system or an archive server as described above, to perform the methods outlined above. Such instructions may be distributed in the form of a computer program product comprising a non-volatile computer-readable medium storing the instructions.

It will be appreciated that any of the features in the embodiments described above for the method according to the first aspect may be combined with the system according to the second aspect of the inventive concept disclosed.

Further objectives of, features of, and advantages with the present inventive concept will become apparent when studying the following detailed disclosure, the drawings and the appended claims. Those skilled in the art will realise that different features of the present inventive concept can be combined to create embodiments other than those described in the following.

BRIEF DESCRIPTION OF THE DRAWINGS

The above, as well as additional objects, features and advantages of the present inventive concept, will be better understood through the following illustrative and non-limiting detailed description of preferred embodiments of the present inventive concept, with reference to the appended drawings. In the drawings like reference numerals will be used for like elements unless stated otherwise.

All the figures are schematic, not necessarily to scale, and generally only show parts which are necessary in order to elucidate the embodiments, wherein other parts may be omitted.

DETAILED DESCRIPTION OF EMBODIMENTS

Detailed embodiments of the present inventive concept will now be described with reference to the drawings. The present inventive concept may, however, be embodied in many different forms and should not be construed as limited to the embodiments set forth herein; rather, these embodiments are provided by way of example so that this disclosure will convey the scope of the inventive concept to those skilled in the art.

Figure 1:
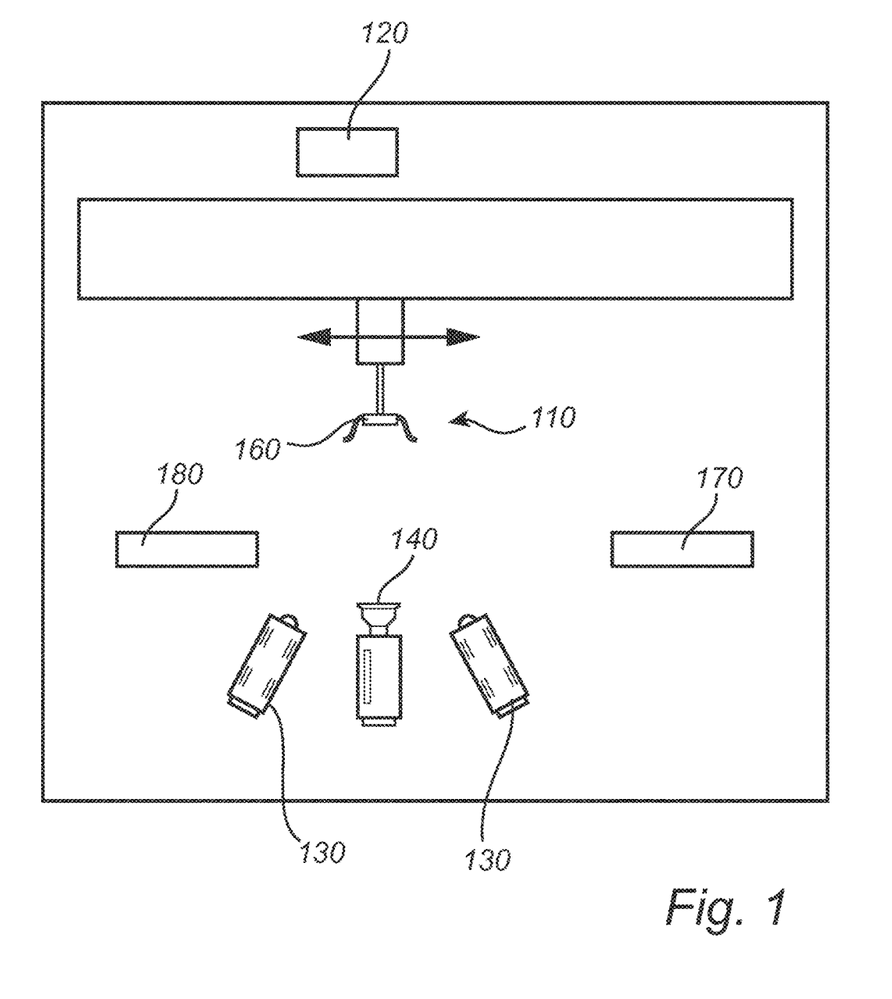
FIG. 1 shows a pick and place machine according to an embodiment.

Embodiments of the present inventive concept generally relate to a method and a system for calibrating illumination settings for components and verifying components using the determined illumination setting in a pick and place machine. Such pick and place machines generally comprise a mounting head 110, an illumination source 130 or multiple illumination sources, a camera 140, and processing means 120. A component 160 to be mounted may be picked up by a mounting head 110, and illuminated by the illumination sources 130 while one or more images are being captured by the camera 140.

The mounting head 110 may comprise a vacuum nozzle for picking up the component 160. The component 160 may be picked, for example, from a component feeder 170 or from a component tape holding components. The mounting head 110 may subsequently place the picked component on a substrate 180, such as a printed wire board or a workpiece (not shown). The mounting head 110 is further arranged to move the component 160 in the field of view of the camera 140 prior to the component is mounted on the workpiece.

The camera 140 may be a line scan camera which the mounting head holding the component passes one or a plurality of times, or an area camera. A line scan camera may contain a single row of pixels used to capture data quickly. As an object moves past the camera, a complete image can be reconstructed in software line by line. An area camera may contain a matrix of pixels that capture an image of a given object. For an area camera to capture an image of an object the object may need to be stationary. The images may be captured when the mounting head 110 holding the component 160 passes the camera, or the mounting head may stop by the camera.

The illumination sources 130 may be arranged to provide different illumination conditions formed by one or several illumination components. The specific illumination conditions provided may e.g. depend on the positioning (and number) of the illumination sources 130, the intensity of the light they generate, and color. The illumination sources 130 will be further discussed in the following.

The processing means 120 may be configured to perform at least some of the steps in the methods described below.

Figure 2:
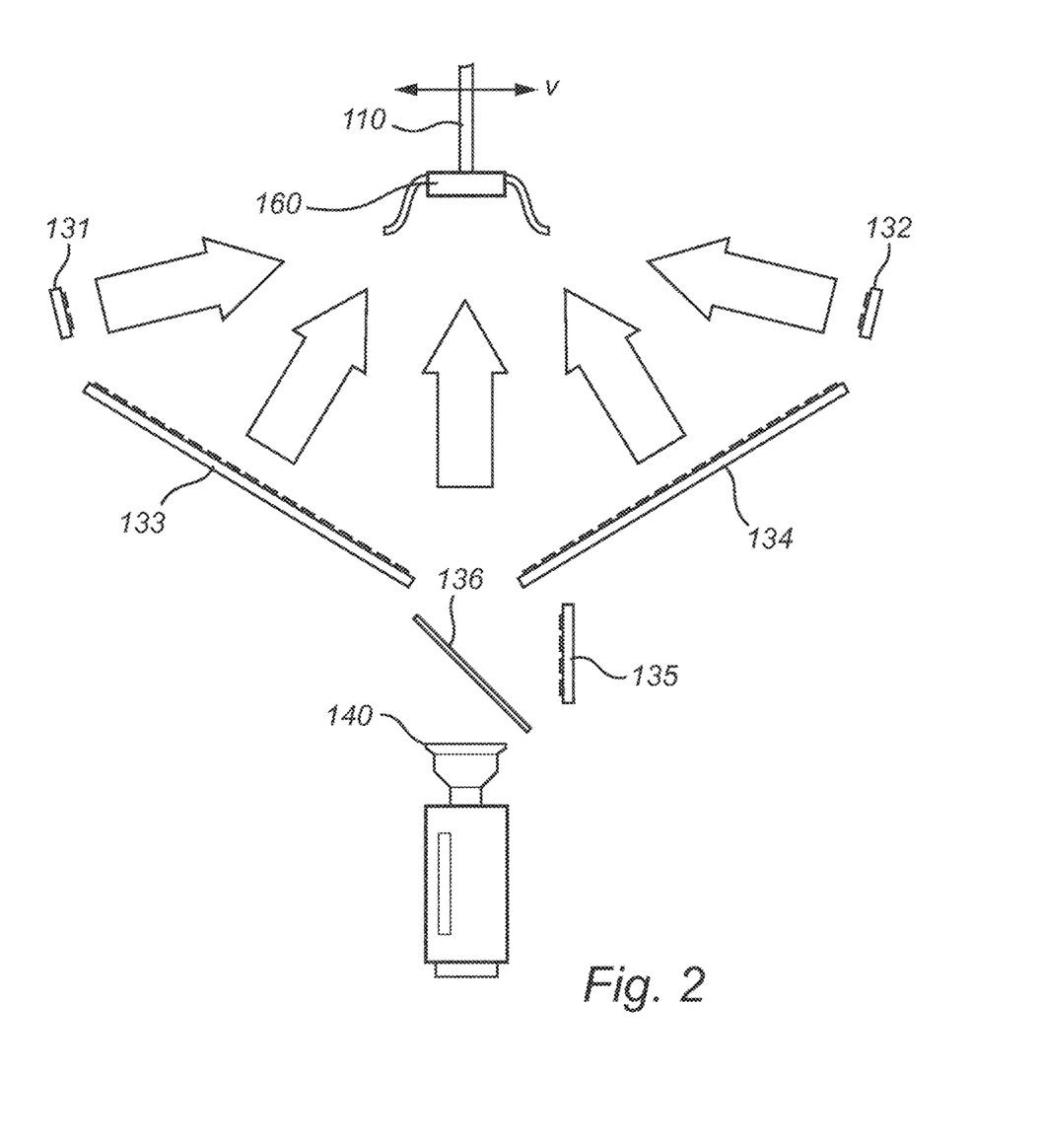
FIG. 2 illustrates a verification system according to an embodiment.

FIG. 2 shows an overview of a verification system in a pick and place machine 100 that may be similarly configured as the pick and place machine discussed in connection with FIG. 1. The pick and place machine 100 may hold a component 160 with mounting head 100. The component may be picked up from a magazine 170 for mounting on a workpiece 180, or for calibration of illumination settings for the pick and place machine 100. The pick and place machine may comprise illumination sources 130, 131, 132, 133, 134, 135 and a camera 140.

The illumination sources 130, 131, 132, 133, 134, 135 may comprise LED lights or LED panels, or other means suitable for illuminating a component. The illumination sources may be operable to provide different illumination components or illumination conditions. In one example, illumination sources 131, 132 form a darkfield illumination component, illumination sources 133, 134 form an ambient illumination component, and illumination source 135 (in this example including a semitransparent mirror 136 guiding the light to the intended angle) form a front light illumination source. By dark field illumination it may be meant that the component is illuminated by light coming from the sides of the component (as seen from the camera), which may causes the component to appear light against a dark background. The front light illumination may be illumination from the same angle as the camera, i.e. from the front side. Ambient illumination may mean illumination from different sides of the component.

An image of the component 160 may be captured by a camera 140. The component may be illuminated by none, one, a plurality of all of the illumination sources 130, 131, 132, 133, 134, 135 with different intensities. An illumination source may be used for generating one or more illumination component. An illumination component may be formed by one or more illumination sources.

The camera may send the captured image data to the processing means 120.

Figure 3:
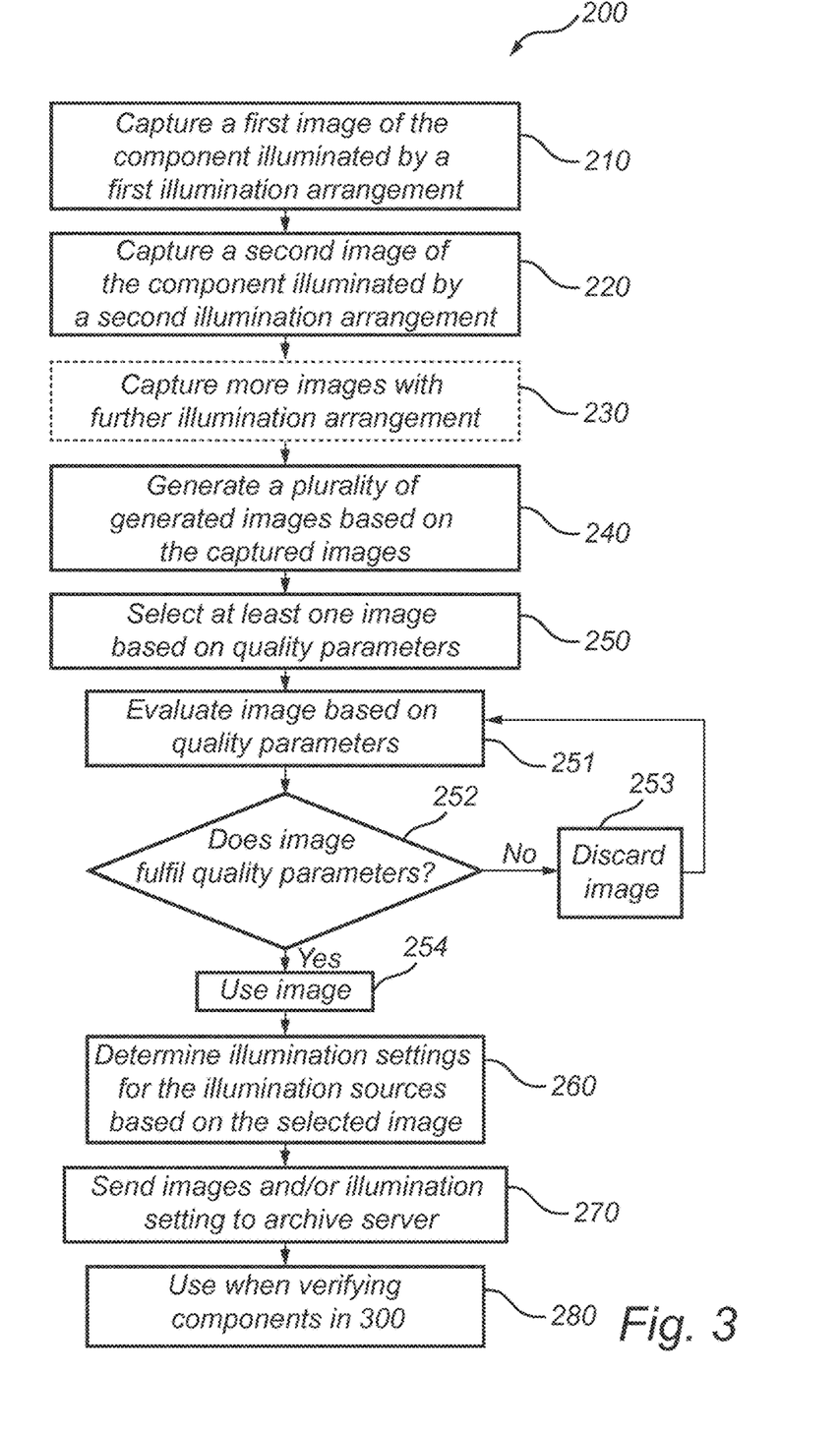
FIG. 3 illustrates a method for determining an illumination setting according to an embodiment.

A method 200 for determining an illumination setting for a component of a package type according to an embodiment will be described with reference to FIG. 3. The method may be performed when calibrating or recalibrating the machine for a component of a package type. For example, when a new package type is to be mounted by the machine, or when it has been realized that the previous calibration was not sufficient.

The method may at least partly be performed by a processing means 120 of a pick and place machine 100. The processing means 120 may be integrated in the pick and place machine 100, or be physically separated from the pick and place machine. Further, the processing means may be structurally integrated as one unit or structurally distinct, i.e., physically separated and/or located in different physical or geographical positions, even if connected or being connectable to each other via e.g. a communication network.

The method comprises a step 210 of capturing a first image of a component 160, held by a mounting head 110 and illuminated by an illumination source 130 with a first illumination component, by a camera 140. The first illumination component may for example be ambient light, as produced by illumination sources 133 and 134. The method may further comprise a step 220 to capture a second image of a component 160, held by the mounting head 110 and illuminated by an illumination source 130 with a second illumination component, by camera 140. The second illumination component may for example be front light, as produced by illumination source 135 and a mirror 136 to direct the light.

The first image of the first component when illuminated by a first illumination component and the second image of the first component when illuminated by a second illumination component, or other images captured of the component when illuminated with other illumination components, may in the present application be referred to as "reference images". The reference images may correspond to maximum illumination of a specific illumination source or arrangement.

Optionally, the method comprises further steps 230 of capturing further images of the component illuminated by different illumination components. For example, a background illumination image may be captured. When capturing the background illumination image, none of the light sources 130, 131, 132, 133, 134, 135 are used, i.e. the component is only illuminated by background light. Also other illumination components, for example other colors or angels, may be used for capturing other reference images.

Steps 210-230 may be performed in any order.

The intensity of the illumination, i.e. the brightness of the illumination sources, may be set such that at least some pixels in each of the captured images are saturated or almost saturated. This may also be referred to as the maximum intensity of the illumination, as any higher intensity may cause information for different pixels to be lost and decrease the granularity of the image.

The method further comprises a step 240 of generating a plurality of generated images based on the captured images of steps 210-230. The generated images may be any combination of the images with different intensities. As an illustrative example only, each of the images may be included with 0-100% in a generated image, for example with 1 point intervals, where 100 is the maximum intensity, i.e. the image as captured, and 0 is no inclusion. If steps 210-230 captured 3 different images with different illumination settings, each of the three images may be included in a generated image with one of 0-100%. Thus, 100*100*100=1000000 images could be generated with different simulated combinations of the captured images, or reference images. The position of the component in the different captured images may be exactly the same, or approximately the same, or the images may be adjusted so that the position of the component in the images is exactly, or approximately, the same. To create a generated image where the component is clearly visible, the component should preferably be in the same place in all of the images that are used for blending or combining into a generated image.

Generating 240 the plurality of generated images may also comprise subtracting the background image, if any, from the reference images. The reference images may then be combined, and the background image may be added. In this way, the background image light is not accounted for more than once.

When, or at the same time as, the generated images have been generated from the reference images, the generated images are scanned for quality parameters or quality measures and one is selected in step 250. Quality parameter or measures may, for example, be predetermined features of an image, such as contrast, color, brightness, or similar, or it may be pre-generated quality measures as determined by a machine learning algorithm.

Each of the images may be scanned 521 for the quality measures to determine 252 the best one, i.e. the best one based on the quality parameters, or the images may be scanned until an image that fulfils the quality measures have been found. If an image fulfils the quality measures it may be used 254, otherwise the image may be discarded 253. If no image fulfils the quality parameters, the best image with respect to those parameters may be used. The images may be generated based on previous data of which intervals may be suitable in order to increase the speed of the generation.

Once a generated image has been selected, illumination settings for the package type or component type may be determined 260 based on the generated image. The illumination setting for a package type or component type comprises settings for the illumination sources or modes. For example, if the generated image uses 75% of the full intensity of image A, captured with illumination arrangement A, and 50% of the full intensity of image B, captured with illumination arrangement B, an illumination setting of 75% of maximum intensity for illumination arrangement A and 50% of maximum intensity for illumination arrangement B may be determined. Hence, the level in which the images are used in the selected generated image may correspond to intensity levels of the different intensity levels used when capturing the reference images used to generate the generated image.

Optionally, the determined illumination setting or captured images may be sent 270 to an archive server 500 and/or the reference images may be sent to the archive server 500. The archive server 500 may be any type of server capable of receiving the determined illumination setting. The archive server 500 may store the illumination setting or images and the data may later be used for improving the algorithms for the methods described. More details about the archive server 500 will be described in detail with reference to FIG. 6.

The determined 260 illumination setting for a component type or package type may be used in a method for verifying a component of a package type or component type before mounting, as described with reference to FIG. 4.

Figure 4:
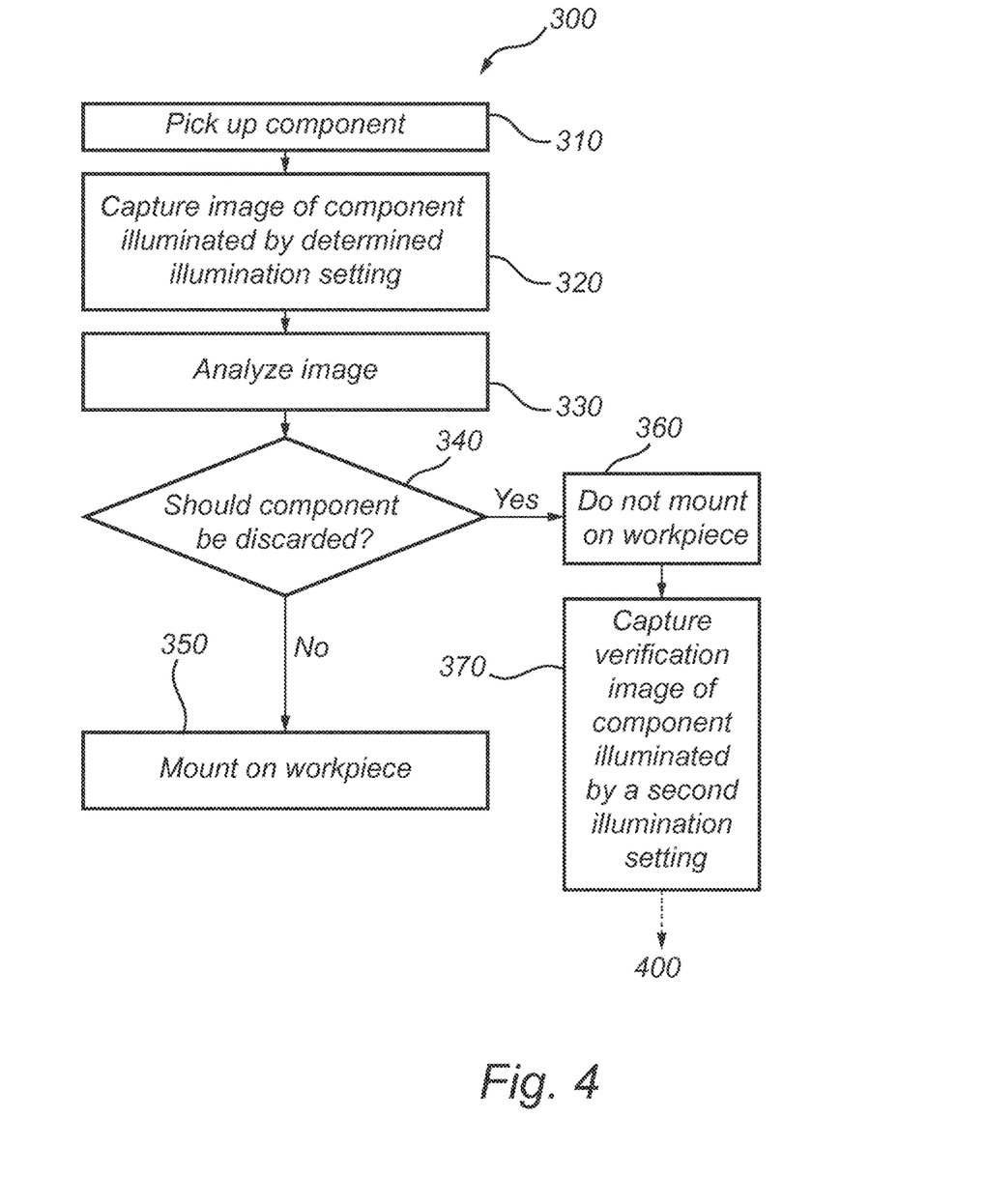
FIG. 4 illustrates a method for verifying a component for mounting.

With reference to FIG. 4, a method 300 for verifying a component for mounting is described, according to an embodiment that may be similar to the embodiments discussed in connection with the previous figures. By "verifying a component" may be understood to determine that the component is not defective, that the component is of the expected package type, and that the component is correctly picked up by the mounting head. The method may be performed by a pick and place machine before mounting a component. By verifying the component before mounting it on a workpiece, faulty workpieces may be avoided or decreased.

The method may comprise a step in which a component is picked up 310 by a mounting head 110. An image of the component, using a determined illumination setting, may be captured 320. The captured image of the component may be analyzed 330, for example by the processing means 120 of the pick and place machine 100. The image may be analyzed by comparing it to a known image of the component, for example as provided by the archive server 500 or from a database. Alternatively, or additionally, the image may be analyzed by an algorithm identifying, for example, the shape, identity, type, position or orientation of the component in the captured image. Based on the analysis of the image it may be determined 340 if the component should be mounted or discarded. If the component is determined to be defective, not of the expected type or if it is incorrectly picked up, it may be discarded. Otherwise, the component may be mounted. If it is determined that the component should be mounted, it may be mounted 350 on a workpiece.

If it is determined that the component should not be mounted, a second image, a verification image, may be captured 370, using a second illumination setting. The second illumination setting may be selected based on the fault found by analyzing 330 the captured image. The second illumination setting may have been determined using the method 200 for determining illumination settings but with different quality measures than used when determining the first illumination setting.

For example, if it is determined in step 330 that the component was incorrectly picked up, an illumination setting suitable for determining if the component is indeed correctly picked up may be used. If it is determined by the analyzing the verification image that the component is not incorrectly picked up, it may be mounted, otherwise it may be discarded. When it has been determined that the component may be discarded, a method 400 for handling the data for the component may be initiated, as described with reference to FIG. 5.

Figure 5:
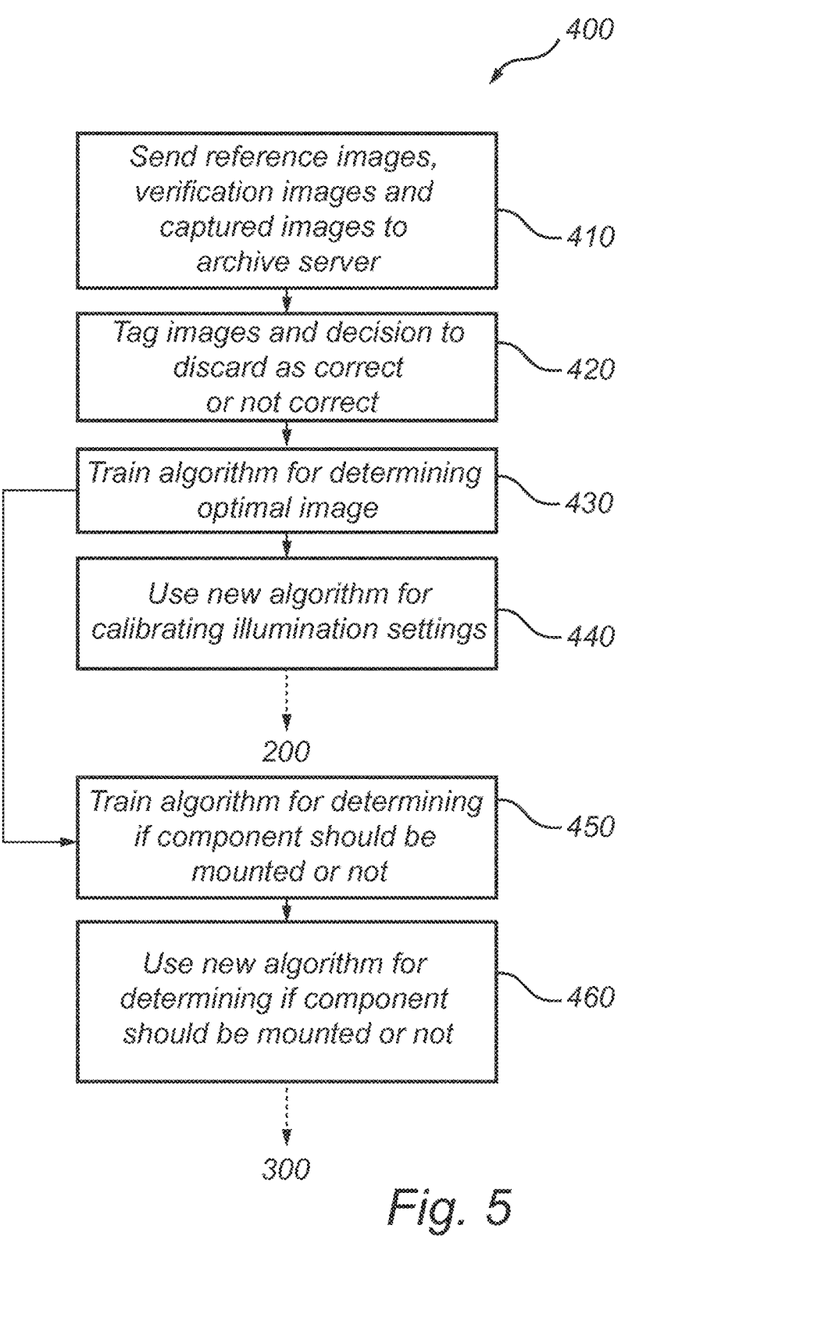
FIG. 5 illustrates a method for handling component data.

With reference to FIG. 5, a method 400 for handling data regarding a component is described, according to an embodiment. The method 400 may be performed by the processing unit 120 of a pick and place machine 100 similar to the pick and place machines discussed with reference to the previous figures, and by a processing means 510 in an archive server 500. With data it may be meant any type of data regarding a component, a component type, a package type or any other data that may be relevant for a pick and place machine.

When a component has been determined to be discarded, new reference images may be captured for the component. The new reference images may be sent to the archive server 500. The captured images of steps 320 and 370 may also be sent to the archive server 500, together with any previous reference images. The images may be tagged 420, for example by a user with knowledge of the components, and the tags may indicate whether the determination not to mount (or to mount if that was the decision) was correct or not.

The algorithm for determining illumination settings, if it is a machine learning algorithm, may be trained 430 based on the tagged data, for example with a supervised learning algorithm. Alternatively, if it is a static algorithm, the algorithm may be changed, and verified with the tagged data. The updated algorithm may then be used 440 in the method 200 for determining an illumination setting, as described with reference to FIG. 3.

The algorithm for determining whether a component should be mounted on a workpiece or not may, similarly as described above, if it is a machine learning algorithm, be trained 450 based on the tagged data, for example with a supervised learning algorithm. Alternatively, if it is a static algorithm, the algorithm may be changed and verified with the tagged data. The updated algorithm may be used 460 in the method 300 for determining if a component should be mounted or not, as described with reference to FIG. 4.

The method 400 as described above is described for when a component has been determined to be discarded, but the method 500 may also be performed irrespectively if the component has been determined to be discarded or not, that is, the same data and images (if captured) may be sent to the archive server even if the component was mounted. This data may be used, by, for example, a developer of pick and place machines, to train algorithms on positive datasets.

Figure 6:
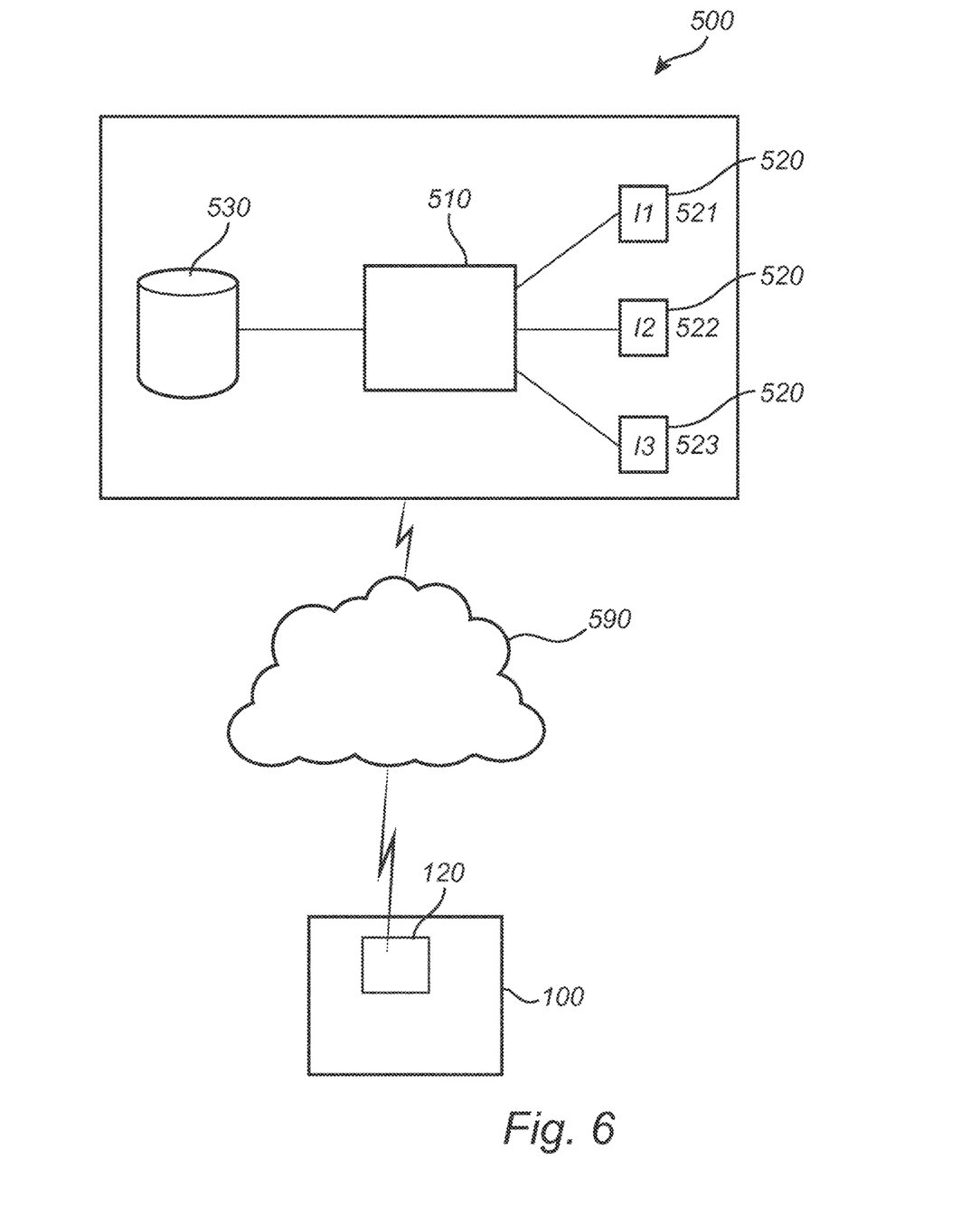
FIG. 6 is an overview of an archive server.

An archive server 500, according to an embodiment, will be described with reference to FIG. 6. The archive server 500 comprises a processing means 510, a storing unit 530, and, in this example, three communication interfaces 520, 521, 522, 523. However, other numbers of interfaces with different functionality may be used. For example, the three interfaces may be one interface with a combined functionality of the three examples described here. The interfaces could be any type of communication interfaces suitable for sending and/or receiving data. For example, an interface may be an API, an endpoint, or a file system.

The storing unit 530 may be any type of storing unit configured to store data. For example purposes only, the storing unit may be a database or a file system. The storing unit may be in the same server as the archive server, or may be on one or more servers. The storing unit 530 may be adapted to store package data relating to the first component and to complement the package data with one or more illumination settings associated with the first component. Also further data may be stored in the storing unit 530, which may be related to the first component or the package type of the first component.

The archive server 500 may receive, through the first communication interface 521, an illumination setting associated with a first component of a specific package type, for example from a pick and place machine 100. The received illumination setting may have been determined by the pick and place machine 100 using the method 200. The received illumination setting may be stored, for example by the processing unit 510, in the storing unit 530. The archive server 500 may provide the illumination setting through a second communication interface 522 adapted to provide the illumination setting upon request from a user. The user may be a person using a software or an application requesting the data.

The archive server may, through a third communication interface 523, receive images of a component captured by a camera when illuminated by an illumination component. The images may be reference images or images of a component when illuminated by illumination sources 130 of a pick and place machine 100, as per determined illumination settings with the method 200. The received data may be stored in the storing unit 530. The received data may be used for improving algorithms for determining illumination settings or verifying components, for example, by being used as training or verification data for a machine learning algorithm, or being used as verification data for a static algorithm.

As described with reference to FIG. 5, the archive server may store and provide data to the method 400 to improve algorithms for determining illumination settings and/or whether a component should be discarded or not.

The person skilled in the art realizes that the present invention by no means is limited to the embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

ITEMIZED EMBODIMENTS

1. A method for determining an illumination setting for capturing an image of a component, belonging to a specific package type, in a pick-and-place machine, the method comprising:
    capturing a first image of a first electronic component of said specific package type while the first electronic component is illuminated by a first illumination arrangement, said capturing of a first image is thereby providing a first illumination component;
    capturing a second image of the first electronic component while the first electronic component is illuminated by a second illumination arrangement, the second illumination arrangement being different from the first illumination arrangement, said capturing of a second image is thereby providing a second illumination component;
    generating, by the use of software manipulation of the first image and the second image, a plurality of generated images of the first component, wherein each one of the plurality of generated images comprises at least a specific combination of an illumination intensity level of the first illumination component and an illumination intensity level of the second illumination component;
    selecting at least one of the plurality of generated images that fulfils a predetermined quality measure;
    determining, based on the selected generated image, an illumination setting associated with said package type, wherein the determined illumination setting comprises at least a first intensity level for the first illumination component and a second intensity level for the second illumination component.
2. The method according to claim 1, further comprising the subsequent steps of:
    capturing an image of a second electronic component of said specific package type while the second electronic component is illuminated according to the determined illumination settings; and
    determining, based on an analysis of the captured image, whether the second electronic component shall be discarded or placed on a workpiece.
3. The method according to claim 2, further comprising the subsequent steps of:
    capturing, in case it is determined that the second electronic component shall be discarded, a verification image of the second electronic component while the second electronic component is illuminated according to a verification illumination setting;
    determining, based on an analysis of the captured verification image, whether the second electronic component shall be discarded or placed on the workpiece.
4. The method according to claim 2, wherein the captured image is analysed with regard to at least one of the following parameters: shape or outline of the component, and position or orientation as held by a mounting head of the pick-and-place machine.
5. The method according to any one of the preceding claims, wherein the first component is held by a mounting head of the pick-and-place machine during the capturing of the first and second images.
6. The method according to any one of the preceding claims, wherein the predetermined quality measure corresponds to a highest image contrast.
7. The method according to any one of the preceding claims, further comprising:
    capturing a background illumination image of the first electronic component;
    subtracting the background illumination image from the first image and the second image prior to the generating of the plurality of generated images.
8. The method according to claim 5, wherein the background illumination image is added to the selected one of the plurality of generated images that fulfils the predetermined quality measure, and wherein the resulting image is stored as a reference image to be used when determining whether a subsequent electronic component of said specific package type shall be discarded or placed on a workpiece.
9. The method according to any of the preceeding claims, wherein:
    the intensity level of the first illumination component, during the capturing of the first image, is selected such that at least some pixels of the first image are saturated or almost saturated; and/or
    the intensity level of the second illumination component, during the capturing of the second image, is selected such that at least some pixels of the second image are saturated or almost saturated.
10. The method according to any one of the preceding claims, wherein the first illumination component represents illumination of the component from a first angle and the second illumination component represents illumination of the component from a second angle, the second angle being different from the first angle.
11. The method according to any one of claims 1 to 9, wherein the first illumination component represents illumination with light of a first colour and the second illumination component represents illumination with light of a second colour, the second colour being different from the first colour.
12. The method according to any one of the preceding claims, wherein the first and second illumination components are selected from the list comprising: dark field illumination, front light illumination, and ambient illumination.
13. The method according to any of the preceeding claims, wherein the method further comprises uploading the determined illumination setting to an archive server.
14. A system for verifying components, belonging to a specific package type, in a pick-and-place machine, the system comprising:
    a first illumination arrangement for illuminating a first electronic component of said specific package type by a first illumination component;
    a second illumination arrangement for illuminating the first electronic component by a second illumination component, the second illumination component being different from the first illumination component;
    a camera for capturing a first image of the electronic component while illuminated by the first illumination component and a second image of the electronic component while illuminated by the second illumination component;

a processing means configured to:

generate, by the use of software manipulation of the first image and the second image, a plurality of generated images of the first electronic component, wherein each one of the plurality of generated images comprises a specific combination of an illumination intensity level of the first illumination component and an illumination intensity level of the second illumination component;

select at least one of the plurality of generated images that fulfils a predetermined quality measure; and determine, based on the selected generated image, an illumination setting associated with said package type, wherein the determined illumination setting comprises a first intensity level for the first illumination component and a second intensity level for the second illumination component.

15. The method according to claim 14, wherein the camera is further adapted to capture an image of a second electronic component of said specific package type while the second electronic component is illuminated according to the determined illumination setting, and wherein the processing means is further configured to determine, based on an analysis of the captured image of the second component, whether the second electronic component shall be discarded or placed on a workpiece.

16. An archive server, having at its disposal:
a first communication interface adapted to receive, from a system according to claim 14, an illumination setting associated with a first component of a specific package type;
a storing unit adapted to store the illumination setting; and
a second communication interface adapted to provide the illumination setting upon request by a user.

17. The archive server according to claim 16, wherein the storing unit is adapted to store package data relating to the first electronic component, and to complement the package data with one or several illumination settings associated with the first electronic component.

18. The archive server according to claim 17, wherein the archive server further has at its disposal:
a third communication interface adapter to receive, from the system according to claim 14, the images of a component captured by the camera when illuminated by the first and second illumination components.

19. The method according to any of claims 1 to 13, wherein the first and second electronic components are both illuminated by a first, a second and a third illumination arrangement each providing a first, a second and a third illumination component, wherein the first, second and third illumination components are all being different from each other.

20. A system for verifying components, belonging to a specific package type, in a pick-and-place machine, the system further comprising:
a first illumination arrangement for illuminating a first electronic component of said specific package type by a first illumination component;
a second illumination arrangement for illuminating the first electronic component by a second illumination component, the second illumination component being different from the first illumination component;
a third illumination arrangement for illuminating the first electronic component by a third illumination component, the third illumination component being different from both the first and second illumination component;

a camera for capturing a first image of the component while illuminated by the first illumination component, a second image of the component while illuminated by the second illumination component and a third image of the component while illuminated by the third illumination component; and a processing means configured to:

generate, by the use of software manipulation of the first image, the second image and the third image, a plurality of generated images of the first electronic component, wherein each one of the plurality of generated images comprises a specific combination of an illumination intensity level of the first illumination component, an illumination intensity level of the second illumination component and an illumination intensity level of the third illumination component;

select at least one of the plurality of generated images that fulfils a predetermined quality measure; and determine, based on the selected generated image, an illumination setting associated with said package type, wherein the determined illumination setting comprises a first intensity level for the first illumination component, a second intensity level for the second illumination component and a third intensity level for the third illumination component.

21. The method according to claim 20, wherein the camera is further adapted to capture an image of a second electronic component of said specific package type while the second electronic component is illuminated according to the determined illumination setting comprising a first intensity level for the first illumination component, a second intensity level for the second illumination component and a third intensity level for the third illumination component, and wherein the processing means is further configured to determine, based on an analysis of the captured image of the second component, whether the second component shall be discarded or placed on a workpiece.

22. The system of any of claim 20 or 21, the camera of said system is further configured to capture a background illumination image of the first electronic component and to subtract the background illumination image from the first image, the second image and the third image.

23. An archive server, having at its disposal:
a first communication interface adapted to receive, from a system according to claim 20, an illumination setting associated with a first component of a specific package type;
a storing unit adapted to store the illumination setting; and
a second communication interface adapted to provide the illumination setting upon request by a user.

24. The archive server according to claim 23, wherein the storing unit is adapted to store package data relating to the first electronic component, and to complement the package data with one or several illumination settings associated with the first electronic component.

25. The archive server according to claim 23 or 24, wherein the archive server further has at its disposal:
a third communication interface adapter to receive, from the system according to claim 20, the images of a component captured by the camera when illuminated by the first, second and third illumination components.

The invention claimed is:
1. A method for determining an illumination setting for capturing an image of a component, belonging to a specific package type, in a pick-and-place machine, the illumination setting being an illumination setting associated with said specific package type, the method comprising:

capturing a first image of a first component of said specific package type while the first component is illuminated by a first illumination condition;

capturing a second image of the first component while the first component is illuminated by a second illumination condition, the second illumination condition being different from the first illumination condition;

perform software manipulation of the first image and the second image to generate a plurality of generated images of the first component based on combining the first image and the second image at different intensities, wherein each one of the plurality of generated images comprises a specific combination of an intensity of the first image and an intensity of the second image, corresponding to a specific combination of an illumination intensity level of the first illumination condition and an illumination intensity level of the second illumination condition;

selecting at least one of the plurality of generated images that fulfils a particular quality measure as a selected generated image; and determining, based on the selected generated image, the illumination setting associated with said specific package type as a determined illumination setting, wherein the determined illumination setting comprises a first illumination intensity level for the first illumination condition corresponding to an intensity of the first image in the selected generated image and a second illumination intensity level for the second illumination condition corresponding to an intensity of the second image in the selected generated image.

2. The method according to claim 1, further comprising:
capturing an image of a second component of said specific package type while the second component is illuminated according to the determined illumination setting; and determining, based on an analysis of the captured image of the second component, whether the second component shall be discarded or placed on a workpiece.

3. The method according to claim 2, further comprising:
capturing, in case it is determined that the second component shall be discarded, a verification image of the second component while the second component is illuminated according to a verification illumination setting as a captured verification image; and determining, based on an analysis of the captured verification image, whether the second component shall be discarded or placed on the workpiece.

4. The method according to claim 2, wherein the captured image of the second component is analysed with regard to a parameter that is at least one of
shape or outline of the component, or
position or orientation as held by a mounting head of the pick-and-place machine.

5. The method according to claim 1, wherein the first component is held by a mounting head of the pick-and-place machine during the capturing of the first and second images.

6. The method according to claim 1, wherein the particular quality measure corresponds to a highest image contrast.

7. The method according to claim 1, further comprising:
capturing a background illumination image of the first component; and
subtracting the background illumination image from the first image and the second image prior to the generating of the plurality of generated images.

8. The method according to claim 1, wherein:
the illumination intensity level of the first illumination condition, during the capturing of the first image, is selected such that at least some pixels of the first image are saturated or almost saturated; and/or
the illumination intensity level of the second illumination condition, during the capturing of the second image, is selected such that at least some pixels of the second image are saturated or almost saturated.

9. The method according to claim 1, wherein the first illumination condition represents illumination of the component from a first angle and the second illumination condition represents illumination of the component from a second angle, the second angle being different from the first angle.

10. The method according to claim 1, wherein the first illumination condition represents illumination with light of a first colour and the second illumination condition represents illumination with light of a second colour, the second colour being different from the first colour.

11. The method according to claim 1, wherein each of the first and second illumination conditions is one of dark field illumination, front light illumination, or ambient illumination.

12. The method according to claim 1, further comprising:
uploading the determined illumination setting to an archive server.

13. A system for verifying components, belonging to a specific package type, in a pick-and-place machine, the system comprising:
a first illumination source for illuminating a first component of said specific package type by a first illumination condition;
a second illumination source for illuminating the first component by a second illumination condition, the second illumination condition being different from the first illumination condition;
a camera for capturing a first image of the first component while illuminated by the first illumination condition and a second image of the first component while illuminated by the second illumination condition; and
a processor configured to:
perform software manipulation of the first image and the second image to generate a plurality of generated images of the first component based on combining the first image and the second image at different intensities, wherein each one of the plurality of generated images comprises a specific combination of an intensity of the first image and an intensity of the second image, corresponding to a specific combination of an illumination intensity level of the first illumination condition and an illumination intensity level of the second illumination condition;
select at least one of the plurality of generated images that fulfils a particular quality measure as a selected generated image; and
determine, based on the selected generated image, an illumination setting associated with said specific package type as a determined illumination setting, wherein the determined illumination setting includes a first intensity level for the first illumination condition corresponding to an intensity of the first image in the selected generated image in the selected generated image and a second intensity level for the second illumination condition in the selected generated image corresponding to an intensity of the second image in the selected generated image.

14. The system according to claim 13, wherein the camera is further configured to capture an image of a second component of said specific package type while the second component is illuminated according to the determined illumination setting, and wherein the processor is further configured to determine, based on an analysis of the captured image of the second component, whether the second component shall be discarded or placed on a workpiece.

15. An archive server, comprising:
- a first communication interface configured to receive, from a system, an illumination setting associated with a specific package type, wherein the system includes
  - a first illumination source for illuminating a first component of said specific package type by a first illumination condition;
  - a second illumination source for illuminating the first component by a second illumination condition, the second illumination condition being different from the first illumination condition;
  - a camera for capturing a first image of the first component while illuminated by the first illumination condition and a second image of the first component while illuminated by the second illumination condition; and
  - a processor configured to:
    - generate, based on software manipulation of the first image and the second image, a plurality of generated images of the first component, wherein each one of the plurality of generated images comprises a specific combination of an illumination intensity level of the first illumination condition and an illumination intensity level of the second illumination condition,
    - select at least one of the plurality of generated images that fulfils a particular quality measure as a selected generated image, and
    - determine, based on the selected generated image, the illumination setting associated with said specific package type as a determined illumination setting, wherein the determined illumination setting includes a first intensity level for the first illumination condition in the selected generated image and a second intensity level for the second illumination condition in the selected generated image;
- a memory configured to store the illumination setting; and
- a second communication interface configured to provide the illumination setting upon request by a user.

16. The archive server according to claim 15, wherein the memory is configured to store package data relating to the first component, and to complement the package data with one or several illumination settings associated with the first component.

17. The archive server according to claim 16, further comprising:
- a third communication interface configured to receive, from the system, images of a component captured by the camera of the system when illuminated by the first and second illumination conditions.

* * * * *